(12) United States Patent
Sakurai

(10) Patent No.: US 12,044,973 B2
(45) Date of Patent: Jul. 23, 2024

(54) SUBSTRATE PROCESSING APPARATUS AND SUBSTRATE PROCESSING METHOD

(71) Applicant: Tokyo Electron Limited, Tokyo (JP)

(72) Inventor: Hiroki Sakurai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 96 days.

(21) Appl. No.: 17/716,207

(22) Filed: Apr. 8, 2022

(65) Prior Publication Data

US 2022/0334491 A1 Oct. 20, 2022

(30) Foreign Application Priority Data

Apr. 20, 2021 (JP) ................. 2021-070786

(51) Int. Cl.
*G03F 7/42* (2006.01)
*H01L 21/02* (2006.01)

(52) U.S. Cl.
CPC .......... *G03F 7/42* (2013.01); *H01L 21/02057* (2013.01)

(58) Field of Classification Search
CPC ......... H01L 21/02052; H01L 21/31127; H01L 21/31133; H01L 21/67051; G03F 7/422; G03F 7/423
See application file for complete search history.

(56) References Cited

U.S. PATENT DOCUMENTS

| | | | |
|---|---|---|---|
| 2002/0132480 A1* | 9/2002 | Shindo | H01L 21/6708 438/689 |
| 2008/0283090 A1* | 11/2008 | DeKraker | H01L 21/31133 134/28 |
| 2012/0247505 A1* | 10/2012 | Brown | H01L 21/31111 156/345.19 |
| 2014/0137892 A1* | 5/2014 | Brown | G03F 7/423 134/18 |

FOREIGN PATENT DOCUMENTS

JP 2014-027245 A 2/2014

* cited by examiner

*Primary Examiner* — Steven Whitesell Gordon
(74) *Attorney, Agent, or Firm* — Venjuris, P.C.

(57) ABSTRACT

A substrate processing apparatus includes: a holding unit that holds a substrate; a liquid discharge unit; a first supply unit; a second supply unit; and a control unit that controls each unit. The liquid discharge unit discharges a processing liquid to the substrate held by the holding unit. The first supply unit supplies the processing liquid to the liquid discharge unit. The second supply unit supplies steam to the liquid discharge unit. The second supply unit includes: a steam generator that generates steam; a supply line; a stabilizing mechanism; a pressure gauge that measures a pressure of the steam flowing through the supply line; and a pressure adjustment mechanism. The control unit controls the pressure adjustment mechanism so that the pressure of the steam measured by the pressure gauge becomes a preset pressure.

11 Claims, 5 Drawing Sheets

SUBSTRATE PROCESSING APPARATUS AND SUBSTRATE PROCESSING METHOD

CROSS-REFERENCE TO RELATED APPLICATION

This application is based on and claims priority from Japanese Patent Application No. 2021-070786 filed on Apr. 20, 2021 with the Japan Patent Office, the disclosure of which is incorporated herein in its entirety by reference.

TECHNICAL FIELD

The present disclosure relates to a substrate processing apparatus and a substrate processing method.

BACKGROUND

In the related art, a technique for removing a resist film formed on a substrate such as a semiconductor wafer (hereinafter, also referred to as a wafer) by a sulfuric acid hydrogen peroxide mixture (SPM) treatment is known. Such an SPM treatment is performed by supplying an SPM solution produced by mixing sulfuric acid and a hydrogen peroxide solution to a resist film on a substrate (see, e.g., Japanese Patent Laid-Open Publication No. 2014-027245).

SUMMARY

A substrate processing apparatus according to an aspect of the present disclosure includes a holding unit, a liquid discharge unit, a first supply unit, a second supply unit, and a control unit. The holding unit holds a substrate. The liquid discharge unit discharges a processing liquid to the substrate held by the holding unit. The first supply unit supplies the processing liquid to the liquid discharge unit. The second supply unit supplies steam to the liquid discharge unit. The control unit controls each unit. Further, the second supply unit includes a steam generator, a supply line, a stabilizing mechanism, a pressure gauge, and a pressure adjustment mechanism. The steam generator generates steam. The supply line supplies steam from the steam generator to the liquid discharge unit. The stabilizing mechanism stabilizes an amount of steam supplied from the steam generator to the supply line. The pressure gauge measures the pressure of steam flowing through the supply line. The pressure adjustment mechanism adjusts the pressure of steam flowing through the supply line. Further, the control unit controls the pressure adjustment mechanism so that the pressure of steam measured by the pressure gauge becomes a preset pressure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
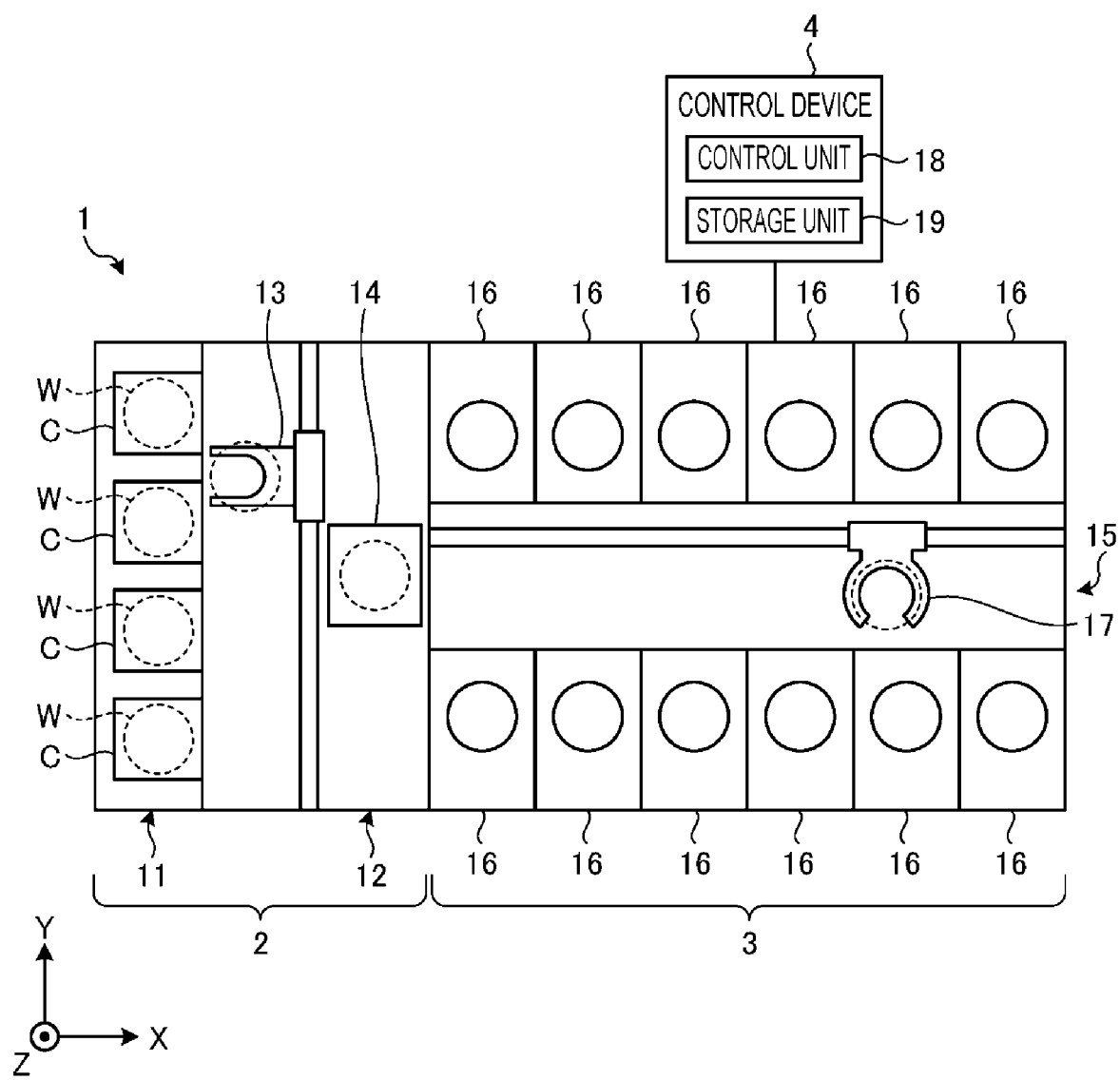
FIG. 1 is a view illustrating a schematic configuration of a substrate processing system according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing apparatus and a substrate processing method disclosed herein will be described in detail with reference to the accompanying drawings. The present disclosure is not limited to the following embodiments. In addition, the drawings are schematic, and a dimensional relationship among elements, the ratio of each element, and the like may differ from the actual situation. Also, in the drawings, there are cases in which parts having different dimensional relationships and ratios are included.

In the related art, a technique for removing a resist film formed on a substrate such as a semiconductor wafer (hereinafter, also referred to as a wafer) by a sulfuric acid hydrogen peroxide mixture (SPM) treatment is known. Such an SPM treatment is performed by supplying an SPM solution produced by mixing sulfuric acid and a hydrogen peroxide solution to a resist film on a substrate.

Further, in the related art, a technique is known for efficiently performing an SPM treatment by discharging high-temperature steam together with the SPM liquid onto a substrate and performing the SPM treatment in a high-temperature environment.

However, in the above-mentioned technique, while the temperature of the processing liquid changes according to the discharge flow rate of steam, it is difficult to directly measure the discharge flow rate of steam, so that it is difficult to stabilize the temperature of the processing liquid. As a result, it has been difficult to obtain a stable process performance in the related art.

Therefore, a technique capable of overcoming the above-mentioned problems and processing a substrate with stable process performance is expected.

Outline of Substrate Processing System

First, a schematic configuration of a substrate processing system 1 according to an embodiment will be described with reference to FIG. 1. FIG. 1 is a view illustrating a schematic configuration of the substrate processing system 1 according to the embodiment. The substrate processing system 1 is an example of a substrate processing apparatus. In the following, in order to clarify positional relationships, the X-axis, the Y-axis, and the Z-axis are defined to be orthogonal to each other, and the positive Z-axis direction is regarded as a vertically upward direction.

As illustrated in FIG. 1, the substrate processing system 1 includes a loading/unloading station 2 and a processing station 3. The loading/unloading station 2 and the processing station 3 are provided adjacent to each other.

The loading/unloading station 2 includes a carrier placing section 11 and a transfer section 12. The carrier placing section 11 is provided to place thereon a plurality of carriers C that accommodates a plurality of substrates, that is, a semiconductor wafer W (hereinafter, referred to as a wafer W) in the embodiment, in a horizontal state.

The transfer section 12 is provided adjacent to the carrier placing section 11, and includes a substrate transfer device 13 and a delivery unit 14 therein. The substrate transfer device 13 includes a wafer holding mechanism that holds the wafer W. Further, the substrate transfer device 13 is movable horizontally and vertically and pivotable around a vertical axis. The substrate transfer device 13 uses the wafer holding mechanism to transfer the wafers W between the carriers C and the delivery unit 14.

The processing station 3 is provided adjacent to the transfer section 12. The processing station 3 includes a transfer section 15 and a plurality of processing units 16. The processing unit 16 is an example of a substrate processing unit. The plurality of processing units 16 are provided at both sides of the transfer section 15.

The transfer section 15 includes a substrate transfer device 17 therein. The substrate transfer device 17 includes a wafer holding mechanism that holds the wafers W. Further, the substrate transfer device 17 is movable horizontally and vertically and pivotable around a vertical axis. The substrate transfer device 17 uses the wafer holding mechanism to transfer the wafers W between the delivery unit 14 and the processing units 16.

The processing unit 16 performs a predetermined substrate processing on the wafers W transferred by the substrate transfer device 17. Details of the processing unit 16 will be described later.

Further, the substrate processing system 1 includes a control device 4. The control device 4 is, for example, a computer, and includes a control unit 18 and a storage unit 19. The storage unit 19 stores a program that controls various processes performed in the substrate processing system 1. The control unit 18 controls the operations of the substrate processing system 1 by reading and executing the program stored in the storage unit 19.

Such a program may be recorded on a storage medium readable by a computer, and may be installed from the storage medium in the storage unit 19 of the control device 4. Examples of a storage medium readable by a computer include a hard disk (HD), a flexible disk (FD), a compact disk (CD), a magnetic optical disk (MO), and a memory card.

In the substrate processing system 1 configured as described above, the substrate transfer device 13 of the loading/unloading station 2 first takes out a wafer W from the carriers C placed in the carrier placing section 11, and then, places the taken wafer W on the delivery unit 14. The wafer W placed on the delivery unit 14 is taken out from the delivery unit 14 by the substrate transfer device 17 of the processing station 3 and loaded into a processing unit 16.

The wafer W loaded into the processing unit 16 is processed by the processing unit 16, and then, unloaded from the processing unit 16 and placed on the delivery unit 14 by the substrate transfer device 17. Then, the processed wafer W placed on the delivery unit 14 is returned to the carriers C of the carrier placing section 11 by the substrate transfer device 13.

Configuration of Processing Unit

Figure 2:
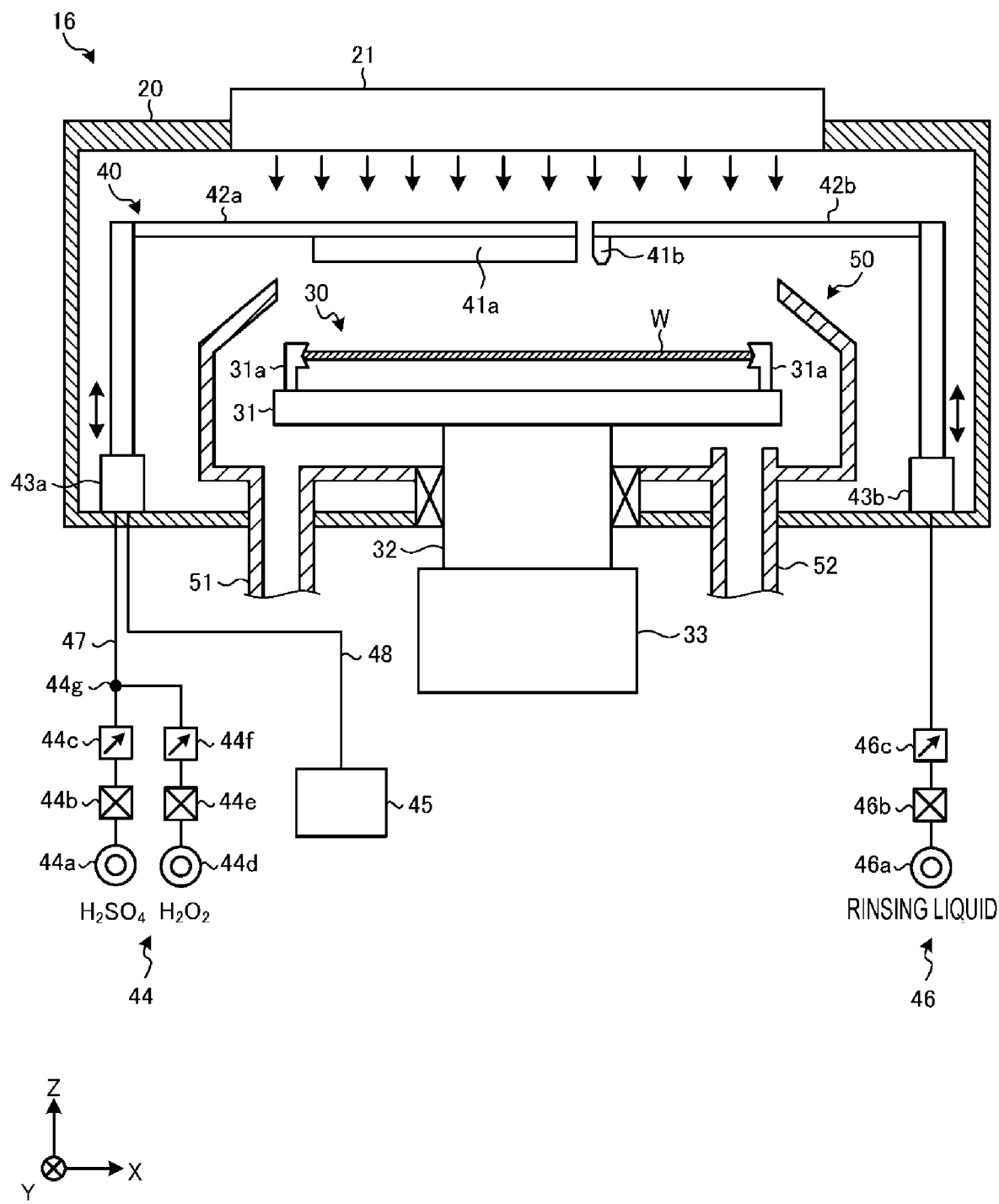
FIG. 2 is a schematic view illustrating a configuration example of a processing unit according to the embodiment.

Next, the configuration of the processing unit 16 will be described with reference to FIGS. 2 to 4. FIG. 2 is a schematic view illustrating a configuration example of the processing unit 16 according to the embodiment. As illustrated in FIG. 2, the processing unit 16 includes a chamber 20, a liquid processing unit 30, a liquid supply unit 40, and a recovery cup 50.

The chamber 20 accommodates the liquid processing unit 30, the liquid supply unit 40, and the recovery cup 50. A fan filter unit (FFU) 21 is provided on the ceiling of the chamber 20. The FFU 21 forms a downflow in the chamber 20.

The liquid processing unit 30 includes a holding unit 31, a support 32, and a driving unit 33, and performs a liquid processing on the placed wafers W. The holding unit 31 holds the wafers W horizontally. The support 32 is a vertically extending member, and the base end is rotatably supported by the driving unit 33, and the holding unit 31 is horizontally supported at the front end. The driving unit 33 rotates the support 32 around the vertical axis.

The liquid processing unit 30 rotates the holding unit 31 supported by the support 32 by rotating the support 32 using the driving unit 33, thereby rotating the wafers W held by the holding unit 31.

A holding member 31a for holding the wafers W from the side surface is provided on the upper surface of the holding unit 31 included in the liquid processing unit 30. The wafers W are horizontally held by the holding member 31a in a state of being slightly separated from the upper surface of the holding unit 31. The wafers W are held by the holding unit 31 with the surface on which the substrate processing is performed facing upward.

The liquid supply unit 40 supplies a processing liquid onto the wafer W. The liquid supply unit 40 includes nozzles 41a and 41b, arms 42a and 42b that horizontally support the nozzles 41a and 41b, respectively, and swivel elevating mechanisms 43a and 43b that swivel and elevate the arms 42a and 42b, respectively. The nozzle 41a is an example of a liquid discharge unit.

The nozzle 41a is, for example, a bar nozzle, and is connected to an SPM liquid supply unit 44 through an SPM liquid supply path 47 and connected to a steam supply unit 45 through a steam supply path 48. The SPM liquid supply unit 44 is an example of a first supply unit, the steam supply unit 45 is an example of a second supply unit, and the steam supply path 48 is an example of a supply line.

The SPM liquid supplied from the SPM liquid supply unit 44 is a chemical liquid produced by mixing sulfuric acid ($H_2SO_4$) and a hydrogen peroxide solution ($H_2O_2$) at a given ratio (e.g., $H_2SO_4:H_2O_2=10:1$). The SPM liquid is used, for example, to remove a resist film formed on the surface of the wafer W.

The SPM liquid supply unit 44 includes a sulfuric acid source 44a, a valve 44b, a flow rate regulator 44c, a hydrogen peroxide source 44d, a valve 44e, a flow rate regulator 44f, and a confluence portion 44g.

The sulfuric acid source 44a supplies sulfuric acid maintained at a given temperature (e.g., 120° C.) to the confluence portion 44g through the valve 44b and the flow rate regulator 44c. The flow rate regulator 44c adjusts the flow rate of sulfuric acid supplied to the confluence portion 44g.

The hydrogen peroxide source 44d supplies a hydrogen peroxide solution to the confluence portion 44g through the valve 44e and the flow rate regulator 44f. The flow rate regulator 44f adjusts the flow rate of the hydrogen peroxide solution supplied to the confluence portion 44g. Further, the confluence portion 44g is connected to the SPM liquid supply path 47.

Then, the SPM liquid produced by mixing sulfuric acid and a hydrogen peroxide solution at the confluence portion 44g is supplied to the nozzle 41a through the SPM liquid supply path 47. Since the SPM liquid generates heat when the sulfuric acid and the hydrogen peroxide solution are mixed, the temperature is raised to a temperature higher than the temperature of the sulfuric acid (e.g., 140° C.) when the nozzle 41a is reached.

The steam supply unit 45 supplies steam to the nozzle 41a. FIG. 3 is a schematic view illustrating a configuration example of the steam supply unit 45 according to the embodiment.

Figure 3:
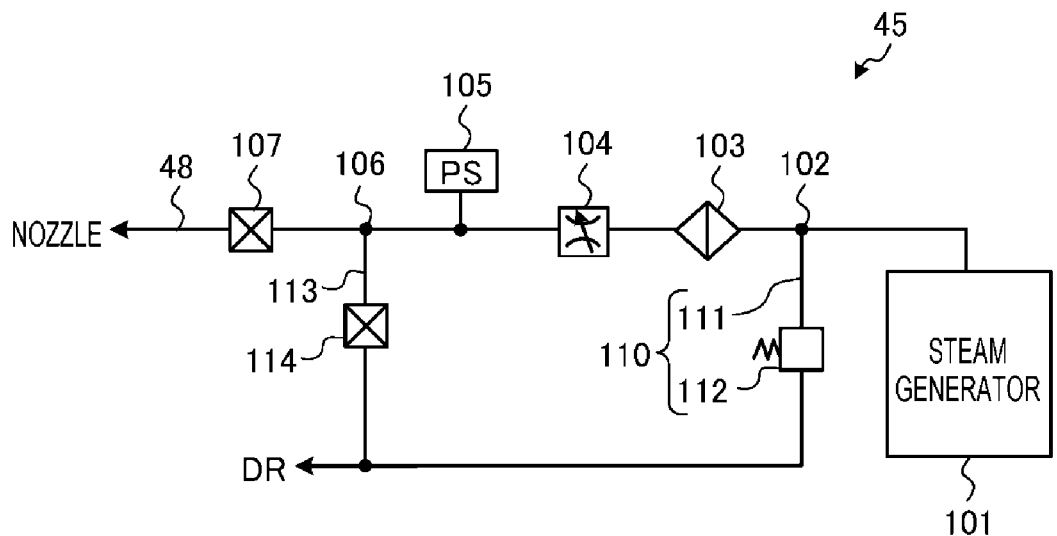
FIG. 3 is a schematic view illustrating a configuration example of a steam supply unit according to the embodiment.

As illustrated in FIG. 3, the steam supply unit 45 includes a steam supply path 48, a steam generator 101, a branch portion 102, a filter 103, a needle valve 104, a pressure gauge 105, a branch portion 106, and a valve 107. The needle valve 104 is an example of a pressure adjustment mechanism, and the valve 107 is an example of a first on-off valve.

The steam generator 101 generates steam, for example, by vaporizing DIW. The steam supply path 48 is connected between the steam generator 101 and the nozzle 41a (see FIG. 2), and supplies the steam generated by the steam generator 101 to the nozzle 41a.

The steam supply path 48 is provided with a branch portion 102, a filter 103, a needle valve 104, a pressure gauge 105, a branch portion 106, and a valve 107 in this order from the upstream side. A first branch line 111 branches from the branch portion 102. The first branch line 111 is connected to a drain portion DR. Further, a back pressure valve 112 is provided on the first branch line 111.

The back pressure valve 112 adjusts the valve opening degree when the pressure of the steam flowing through the branch portion 102 of the steam supply path 48 reaches a given pressure (e.g., 0.1 MPa), thereby suppressing the pressure of the steam flowing through the branch portion 102 from becoming larger than the given pressure.

That is, in the embodiment, the first branch line 111 and the back pressure valve 112 function as a stabilizing mechanism 110 that stabilizes the amount of steam supplied from the steam generator 101 to the steam supply path 48.

The filter 103 removes contaminants such as particles contained in the steam flowing through the steam supply path 48. The needle valve 104 adjusts the valve opening degree based on the control signal from the control unit 18 (see FIG. 1). The pressure gauge 105 measures the pressure of steam flowing through the steam supply path 48.

A second branch line 113 branches from the branch portion 106. The second branch line 113 is connected to the drain portion DR. Further, a valve 114 is provided on the second branch line 113. The valve 114 is an example of a second on-off valve.

Figure 4:
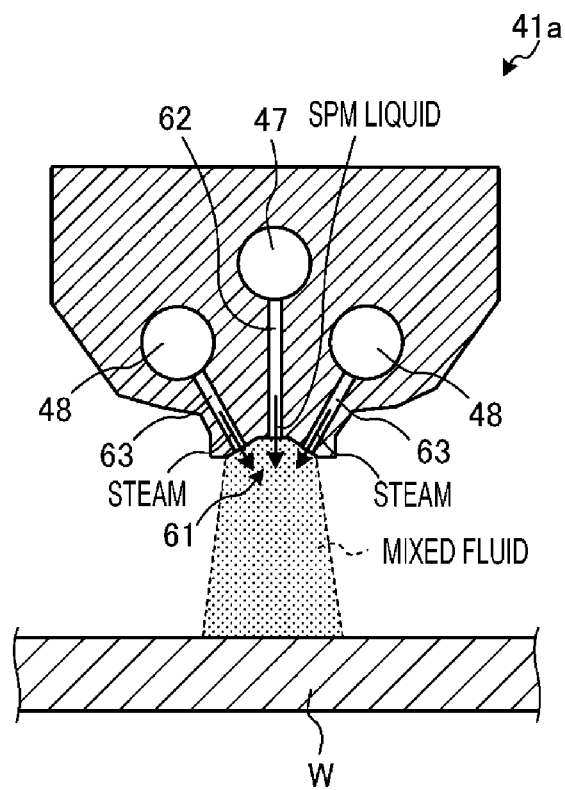
FIG. 4 is a cross-sectional view illustrating a configuration example of a nozzle according to the embodiment.

FIG. 4 is a cross-sectional view illustrating a configuration example of a nozzle 41a according to the embodiment. As illustrated in FIG. 4, inside the nozzle 41a, for example, one SPM liquid supply path 47 and two steam supply paths 48 are inserted side by side along the longitudinal direction of the nozzle 41a.

Further, a discharge path 62 is connected between a discharge port 61 formed on the lower surface of the nozzle 41a and the SPM liquid supply path 47, and a discharge path 63 is connected between the discharge port 61 and the steam supply path 48. That is, the SPM liquid is supplied to the discharge port 61 of the nozzle 41a through the discharge path 62, and steam is supplied through the discharge path 63.

Then, in the nozzle 41a according to the embodiment, the SPM liquid and steam are mixed at the discharge port 61 to generate a mixed fluid. That is, in the present disclosure, the mixed fluid is generated by mixing the SPM liquid and steam between the time when the SPM liquid and steam are discharged from the nozzle 41a and the time when the SPM liquid and steam reach the wafer W. A plurality of discharge ports 61 is placed side by side along the longitudinal direction of the nozzle 41a.

As a result, the nozzle 41a according to the embodiment may discharge the mixed fluid generated by mixing the SPM liquid and steam from the plurality of discharge ports 61 to the wafer W. Further, in the mixed fluid, the temperature of the SPM liquid is further raised (e.g., 160° C. to 180° C.) by steam.

Therefore, according to the embodiment, the resist film formed on the surface of the wafer W may be efficiently removed by treating the surface of the wafer W with the mixed fluid in which the SPM liquid has been heated.

The description of FIG. 2 is referred to again. The nozzle 41b is connected to the rinsing liquid supply unit 46. The rinsing liquid supplied from the rinsing liquid supply unit 46 is used, for example, for rinsing treatment. The rinsing solution according to the embodiment is, for example, a hydrogen peroxide solution, DIW, ozone water, or diluted ammonia water.

The rinsing liquid supply unit 46 includes a rinsing liquid source 46a, a valve 46b, and a flow rate regulator 46c. The rinsing liquid source 46a supplies a rinsing liquid to the nozzle 41b. The flow rate regulator 46c adjusts the flow rate of the rinsing liquid supplied to the nozzle 41b through the valve 46b.

The recovery cup 50 is placed to surround the holding unit 31 and collects the processing liquid scattered from the wafer W by the rotation of the holding unit 31. A drain port 51 is formed at the bottom of the recovery cup 50, and the processing liquid collected by the recovery cup 50 is discharged from the drain port 51 to the outside of the processing unit 16.

Further, an exhaust port 52 is formed at the bottom of the recovery cup 50 to discharge the gas supplied from the FFU 21 to the outside of the processing unit 16.

Details of Substrate Processing

Figure 5:
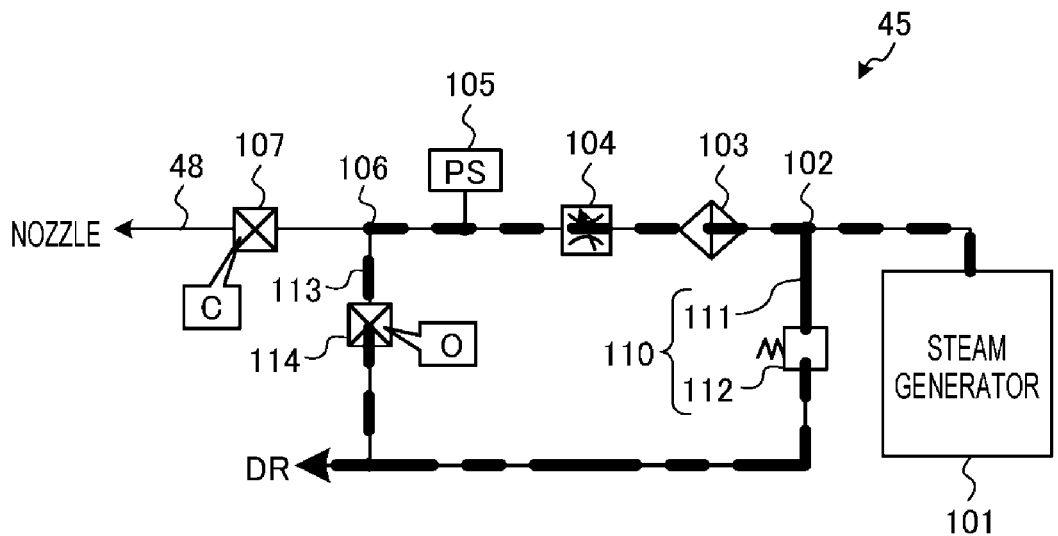
FIG. 5 is a schematic view illustrating a step of a substrate processing according to the embodiment.

Next, details of a substrate processing according to the embodiment will be described with reference to FIGS. 5 and 6. FIG. 5 is a schematic view illustrating a step of a substrate processing according to the embodiment.

First, as illustrated in FIG. 5, the control unit 18 (see FIG. 1) controls the valve 107 to the closed state and controls the valve 114 to the open state in a standby state in which the wafer W (see FIG. 2) is not processed by the processing unit 16 (see FIG. 2). In the following drawings, the valve in the open state is described as "O," and the valve in the closed state is described as "C."

As a result, the steam generated by the steam generator 101 is discharged to a drain portion DR through a branch portion 102, a filter 103, a needle valve 104, a pressure gauge 105, a branch portion 106, a second branch line 113, and a valve 114, as indicated by the thick broken line.

Further, when the pressure of the steam generated by the steam generator 101 is higher than the given pressure, the back pressure valve 112 is opened. As a result, the steam generated by the steam generator 101 is discharged to the drain portion DR through the branch portion 102, a first branch line 111, and a back pressure valve 112, as indicated by the thick alternate long and short dash line.

In the standby state, the control unit 18 reads information regarding a given correlation (hereinafter, also referred to as "correlation information") from the storage unit 19 (see FIG.

1). The correlation information relates to the correlation between the temperature of the mixed fluid of the SPM liquid and steam discharged from the nozzle 41a (see FIG. 2) and the pressure of steam in the steam supply path 48 measured by the pressure gauge 105.

The correlation information is stored in the storage unit 19 in the same form as, for example, an arithmetic expression obtained from the correlation between the temperature of the mixed fluid discharged from the nozzle 41a and the pressure measured by the pressure gauge 105.

The correlation information may be created, for example, by the following method. First, an IR sensor measures the temperature of the mixed fluid when the mixed fluid of the SPM liquid and steam is discharged from the nozzle 41a.

In the temperature measurement process of the mixed fluid, the temperature of the mixed fluid that reaches a steady level when the mixed fluid is continuously discharged for a certain period of time or longer, and the nozzle 41a is sufficiently heated, may be used as a measured value.

Next, a relationship between the measured temperature of the mixed fluid and the pressure of the steam measured by the pressure gauge 105 when the temperature is measured is plotted on the X-Y plane. Then, an arithmetic expression is derived based on the plurality of plots on the X-Y plane, and the derived arithmetic expression is stored in the storage unit 19 as correlation information.

The correlation information according to the embodiment is not limited to the arithmetic expression, and may be, for example, a table in which the correlation between the temperature of the mixed fluid discharged from the nozzle 41a and the pressure of steam measured by the pressure gauge 105 is recorded.

The control unit 18 also reads information regarding a desired discharge temperature of the mixed fluid (hereinafter, referred to as "discharge temperature information") from the recipe information regarding the processing of the wafer W to be processed next, together with the correlation information described so far.

Then, the control unit 18 derives the pressure value by the pressure gauge 105 corresponding to the discharge temperature information by referring to the correlation information using the discharge temperature information as an input parameter. Further, the control unit 18 sets the derived pressure value as the pressure value of the steam in the steam supply path 48.

As described above, in the embodiment, the control unit 18 sets the pressure value of the steam in the steam supply path 48 based on the correlation information stored in advance in the storage unit 19 and the discharge temperature information included in the recipe information.

Subsequently, the control unit 18 transfers the wafer W to be processed next into the processing unit 16 and maintains the wafer W by the holding unit 31 (see FIG. 2). Further, the control unit 18 places the nozzle 41a above the wafer W.

Figure 6:
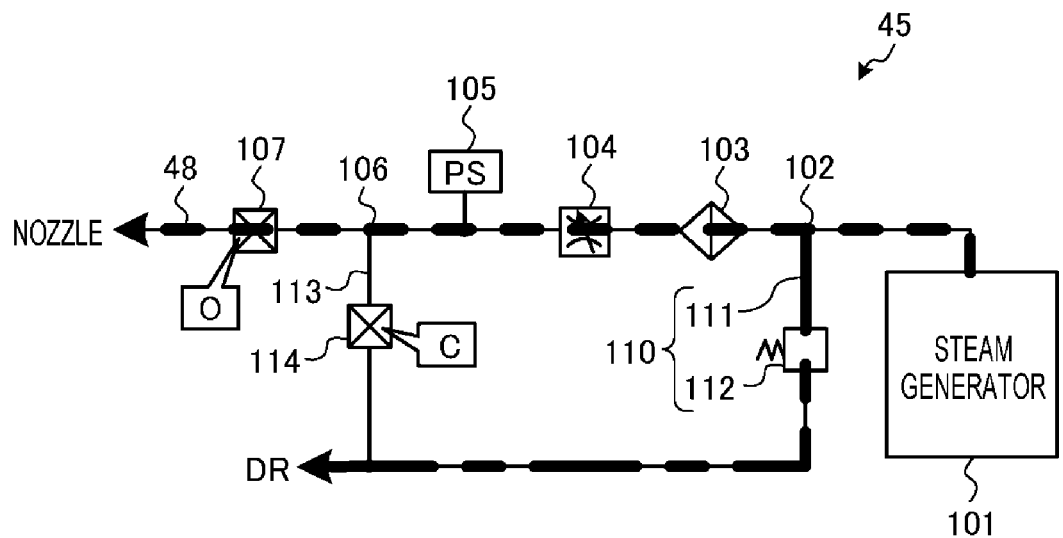
FIG. 6 is a schematic view illustrating a step of a substrate processing according to the embodiment.

As illustrated in FIG. 6, the control unit 18 controls the valve 107 in the open state and controls the valve 114 in the closed state. Then, the steam generated by the steam generator 101 is supplied to the nozzle 41a through the branch portion 102, the filter 103, the needle valve 104, the pressure gauge 105, the branch portion 106, and the valve 107, as indicated by the thick broken line.

Further, the control unit 18 controls the SPM liquid supply unit 44 (see FIG. 2) in parallel with the process of supplying steam to the nozzle 41a, and supplies the SPM liquid to the nozzle 41a. As a result, the control unit 18 may discharge the mixed fluid of the SPM liquid and steam from the nozzle 41a to the wafer W.

In the embodiment, the control unit 18 feedback-controls the valve opening degree of the needle valve 104 in parallel with the discharging process of the mixed fluid to the wafer W so that the pressure value measured by the pressure gauge 105 becomes the pressure value set above.

As a result, since the pressure value corresponding to the desired discharge temperature may be maintained in the steam supply path 48, the discharge temperature of the mixed fluid discharged from the nozzle 41a may be controlled to be the desired discharge temperature included in the recipe information. Therefore, according to the embodiment, the wafer W may be processed with stable process performance.

Further, in the embodiment, a stabilizing mechanism 110 for stabilizing the pressure of steam may be provided on the upstream side of the needle valve 104 and the pressure gauge 105 that perform a feedback control of the pressure in the steam supply path 48.

As a result, the feedback control by the needle valve 104 and the pressure gauge 105 may be stably performed. Therefore, according to the embodiment, the wafer W may be processed with more stable process performance.

Further, in the embodiment, the stabilizing mechanism 110 may be composed of the first branch line 111 and the back pressure valve 112. As a result, the pressure of steam in the steam supply path 48 may be stabilized with a simple configuration, so that the manufacturing cost of the substrate processing system 1 may be reduced.

Further, in the embodiment, the control unit 18 may set the pressure value of the steam in the steam supply path 48 by using the correlation information which is an arithmetic expression. As a result, since the pressure value of the steam in the steam supply path 48 may be set by a simple process, the processing load of the control unit 18 may be reduced.

In the embodiment, in the standby state illustrated in FIG. 5, instead of simply closing the valve 107, the second branch line 113 and the valve 114 may be used to continuously cause steam to flow through the filter 103 and the needle valve 104 even in the standby state.

As a result, the filter 103 and the needle valve 104 may be continuously heated to the same temperature as during the discharging process, so that the above-mentioned feedback control may be stably performed. Therefore, according to the embodiment, the wafer W may be processed with more stable process performance.

Further, in the embodiment, the wafer W may be processed with a mixed fluid in which the steam supplied from the steam supply unit 45 is mixed with the SPM liquid. That is, in the embodiment, the processing liquid for substrate processing in which steam is mixed may be the SPM liquid. As a result, the resist formed on the wafer W and the slurry remaining on the wafer W at the time of a chemical mechanical polishing (CMP) process may be satisfactorily removed.

The processing liquid according to the embodiment is not limited to the SPM liquid, and may be, for example, SC-1 (a mixed aqueous solution of $NH_4OH$ and $H_2O_2$), SC-2 (a mixed aqueous solution of HCl and $H_2O_2$), or dilute hydrofluoric acid (DHF).

As for the correlation information according to the embodiment, individual correlation information for each processing unit 16 may be stored in the storage unit 19, or the correlation information common to the plurality of processing units 16 provided in the substrate processing system 1 may be stored in the storage unit 19.

The substrate processing apparatus (substrate processing system 1) according to the embodiment includes a holding unit 31, a liquid discharge unit (nozzle 41a), a first supply unit (SPM liquid supply unit 44), and a second supply unit (steam supply unit) 45, and a control unit 18. The holding unit 31 holds the wafer W horizontally. The liquid discharge unit (nozzle 41a) discharges the processing liquid to the substrate (wafer W) held by the holding unit 31. The first supply unit (SPM liquid supply unit 44) supplies the processing liquid to the liquid discharge unit (nozzle 41a). The second supply unit (steam supply unit 45) supplies steam to the liquid discharge unit (nozzle 41a). The control unit 18 controls each part. The second supply unit (steam supply unit 45) includes a steam generator 101, a supply line (steam supply path 48), a stabilizing mechanism 110, a pressure gauge 105, and a pressure adjustment mechanism (needle valve 104). The steam generator 101 generates steam. The supply line (steam supply path 48) supplies steam from the steam generator 101 to the liquid discharge unit (nozzle 41a). The stabilizing mechanism 110 stabilizes the amount of steam supplied from the steam generator 101 to the supply line (steam supply path 48). The pressure gauge 105 measures the pressure of steam flowing through the supply line (steam supply path 48). The pressure adjustment mechanism (needle valve 104) adjusts the pressure of steam flowing through the supply line (steam supply path 48). Further, the control unit 18 controls the pressure adjustment mechanism (needle valve 104) so that the pressure of the steam measured by the pressure gauge 105 becomes a preset pressure. As a result, the wafer W may be processed with stable process performance.

Further, in the substrate processing apparatus (substrate processing system 1) according to the embodiment, the control unit 18 obtains a preset pressure based on a correlation between the temperature of the mixed fluid of the processing liquid and steam discharged from the liquid discharge unit (nozzle 41a) and the pressure of steam. As a result, the discharge temperature of the mixed fluid discharged from the nozzle 41a may be accurately controlled.

Further, in the substrate processing apparatus (substrate processing system 1) according to the embodiment, the control unit 18 calculates a preset pressure based on an arithmetic expression obtained from the correlation. As a result, the processing load of the control unit 18 may be reduced.

Further, in the substrate processing apparatus (substrate processing system 1) according to the embodiment, the stabilizing mechanism 110 includes a first branch line 111 that branches from the supply line (steam supply path 48) and a back pressure valve 112 provided on the first branch line 111. Thus, the manufacturing cost of the substrate processing system 1 may be reduced.

Further, in the substrate processing apparatus (substrate processing system 1) according to the embodiment, the second supply unit (steam supply unit 45) further includes a first on-off valve (valve 107), a second branch line 113, and a second on-off valve (valve 114). The first on-off valve (valve 107) is provided on the downstream side of the pressure gauge 105 in the supply line (steam supply path 48). The second branch line 113 branches between the pressure gauge 105 and the first on-off valve (valve 107) in the supply line (steam supply path 48). The second on-off valve (valve 114) is provided on the second branch line 113. Further, when steam is not supplied to the liquid discharge unit (nozzle 41a), the control unit 18 closes the first on-off valve (valve 107) and opens the second on-off valve (valve 114). As a result, the wafer W may be processed with more stable process performance.

In the substrate processing apparatus (substrate processing system 1) according to the embodiment, the processing liquid is a mixed liquid (SPM liquid) of sulfuric acid and hydrogen peroxide. As a result, the resist formed on the wafer W and the slurry at the time of CMP process remaining on the wafer W may be satisfactorily removed.

Procedure of Substrate Processing

Figure 7:
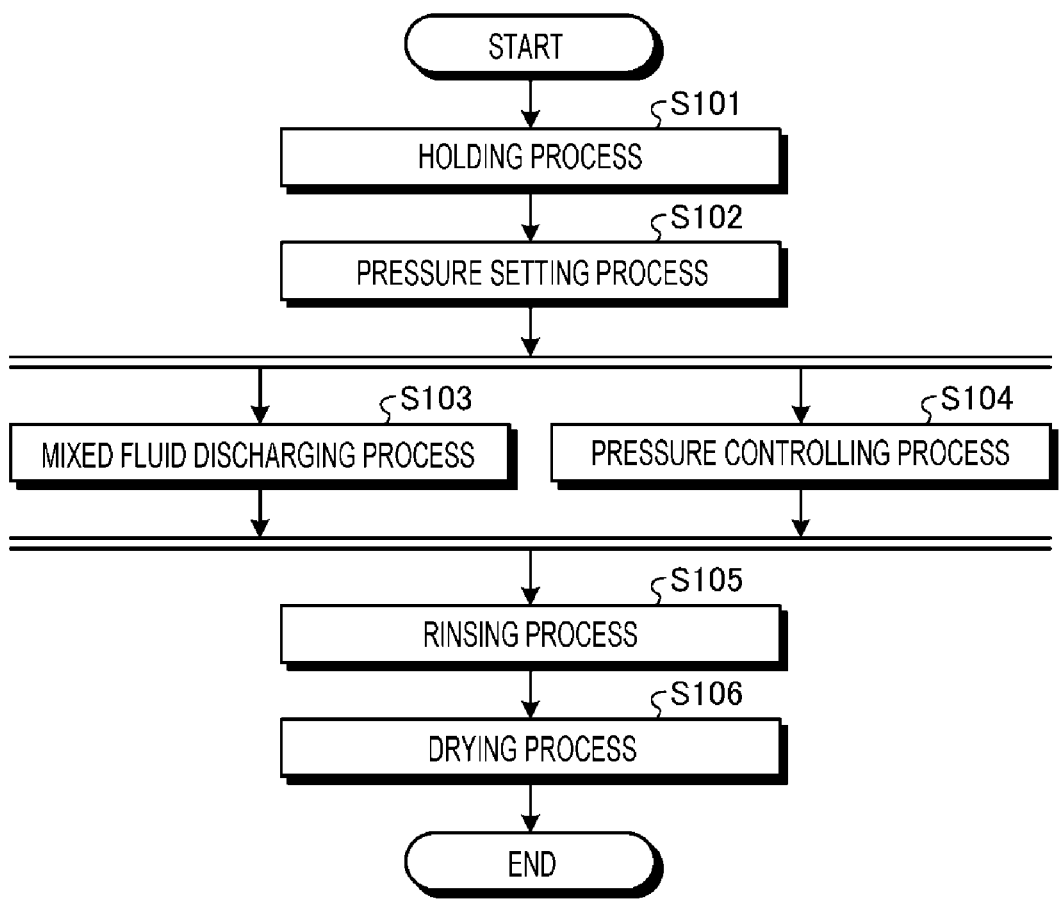
FIG. 7 is a flow chart illustrating a substrate processing procedure executed by the substrate processing system according to the embodiment.

Subsequently, the procedure of substrate processing according to the embodiment and various modifications will be described with reference to FIG. 7. FIG. 7 is a flow chart illustrating a substrate processing procedure executed by the substrate processing system 1 according to the embodiment.

First, the control unit 18 controls the processing unit 16 to perform a holding process for holding the wafer W by the holding unit 31 (step S101). Then, the control unit 18 performs a pressure setting process for setting the pressure of the steam in the steam supply path 48 based on the correlation information stored in advance in the storage unit 19 and the discharge temperature information included in the recipe information of the wafer W to be processed next (step S102).

In the example of FIG. 7, an example is illustrated in which the pressure setting process (step S102) is performed after the wafer W holding process (step S101). However, the present disclosure is not limited to such an example, and the pressure setting process may be performed before the holding process, or both processes may be performed in parallel.

Next, the control unit 18 controls the SPM liquid supply unit 44 and the steam supply unit 45 to perform a mixed fluid discharging process of discharging the mixed fluid of the SPM liquid and the steam from the nozzle 41a to the wafer W (step S103).

Further, in parallel with the process of step S103, the control unit 18 performs a pressure controlling process for feedback-controlling the valve opening degree of the needle valve 104 so that the pressure value measured by the pressure gauge 105 becomes the pressure value set in the previous pressure setting process (step S104).

Next, the control unit 18 controls the rinsing liquid supply unit 46 to perform a rinsing process of the wafer W with the rinsing liquid (step S105). Then, the control unit 18 controls the processing unit 16 to perform a drying process (e.g., spin drying) of the wafer W (step S106), and a series of substrate processing is completed.

The substrate processing method according to the embodiment includes a pressure setting step (step S102) and a pressure controlling step (step S104) in the above-mentioned substrate processing apparatus (substrate processing system 1). The pressure setting step (step S102) sets the pressure of steam in the supply line (steam supply path 48) based on the desired discharge temperature. The pressure controlling step (step S104) controls the pressure adjustment mechanism (needle valve 104) so that the pressure of the steam measured by the pressure gauge 105 becomes the pressure set in the pressure setting step (step S102). As a result, the wafer W may be processed with stable process performance.

Although the embodiments of the present disclosure have been described above, the present disclosure is not limited thereto, and various changes may be made without departing from the spirit of the present disclosure. For example, in the above-described embodiments, an example has been described in which the rinsing process and the drying process are carried out after the substrate processing with the mixed fluid, but a cleaning process may be carried out between the SPM process and the rinsing process. Such a cleaning process may be carried out, for example, by discharging SC-1 onto the surface of the wafer W.

Further, in the above-described embodiments, an example has been described in which spin drying is performed as a drying process, but spin drying may be performed after a drying liquid (e.g., isopropyl alcohol (IPA)) is discharged onto the surface of the wafer W.

According to the embodiment, the substrate may be processed with stable process performance.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a holder configured to hold a substrate;
   a liquid discharge configured to discharge a processing liquid to the substrate held by the holder;
   a first supply configured to supply the processing liquid to the liquid discharge;
   a second supply configured to supply steam to the liquid discharge, the second supply comprising:
     a steam generator configured to generate steam;
     a supply line configured to supply the steam from the steam generator to the liquid discharge;
     a pressure sensor configured to measure a pressure of the steam flowing through the supply line;
     a pressure adjuster configured to adjust the pressure of the steam flowing through the supply line; and
     a stabilizer in communication with the supply line intermediate the steam generator and 1) the pressure sensor, and 2) the pressure adjuster, the stabilizer configured for performing a feedback control of the steam pressure in the supply line; and
   a controller at least in communication with the pressure sensor and the pressure adjuster, and is configured to:
   1) determine a discharge temperature of a mixed fluid of the processing liquid and the steam, from the liquid discharge, by applying a correlation between the pressure of the steam and an associated discharge temperature of the mixed fluid of the processing liquid and the steam, for removal of a resist film on a substrate surface when the substrate is held on the holder, 2) obtain the pressure of the steam from the pressure sensor, and 3) signal the pressure adjuster to adjust the pressure of the steam flowing through the supply line to a preset pressure, so that the preset pressure of the steam corresponds to a selected discharge temperature of the mixed fluid of the processing liquid and the steam in accordance with the correlation.

2. The substrate processing apparatus according to claim 1, wherein the controller obtains the correlation from storage media in communication with the controller.

3. The substrate processing apparatus according to claim 2, wherein the controller calculates the preset pressure based on an arithmetic expression obtained from the correlation.

4. The substrate processing apparatus according to claim 3, wherein the stabilizer includes:
   a first branch line branching from the supply line; and
   a back pressure valve provided in the first branch line.

5. The substrate processing apparatus according to claim 4, wherein the second supply further includes:
   a first on-off valve provided in a downstream side of the pressure gauge in the supply line;
   a second branch line branching between the pressure gauge and the first on-off valve in the supply line; and
   a second on-off valve provided in the second branch line, and
   wherein, when the steam is not supplied to the liquid discharge, the controller signals the first on-off valve to close and the second on-off valve to open.

6. The substrate processing apparatus according to claim 5, wherein the processing liquid comprises a mixed liquid of sulfuric acid and hydrogen peroxide.

7. The substrate processing apparatus according to claim 1, wherein the stabilizer includes:
   a first branch line branching from the supply line; and
   a back pressure valve provided in the first branch line.

8. The substrate processing apparatus according to claim 1, wherein the second supply further includes:
   a first on-off valve provided in a downstream side of the pressure gauge in the supply line;
   a second branch line branching between the pressure gauge and the first on-off valve in the supply line; and
   a second on-off valve provided in the second branch line, and
   wherein, when the steam is not supplied to the liquid discharge, the controller signals the first on-off valve to close and the second on-off valve to open.

9. The substrate processing apparatus according to claim 1, wherein the processing liquid comprises a mixed liquid of sulfuric acid and hydrogen peroxide.

10. A substrate processing method comprising:
    providing a substrate processing apparatus including:
      a holder configured to hold a substrate;
      a liquid discharge configured to discharge a processing liquid to the substrate held by the holder;
      a first supply configured to supply the processing liquid to the liquid discharge; and
      a second supply configured to supply steam to the liquid discharge, and including:
        a steam generator configured to generate steam;
        a supply line configured to supply the steam from the steam generator to the liquid discharge;
        a pressure sensor configured to measure a pressure of the steam flowing through the supply line; and
        a pressure adjuster configured to adjust the pressure of the steam flowing through the supply line; and
        a stabilizer in communication with the supply line intermediate the steam generator and 1) the pressure sensor, and 2) the pressure adjuster, the stabilizer configured for performing a feedback control of the steam pressure in the supply line; and
    controlling the pressure sensor and the pressure adjuster to: 1) determine a discharge temperature of a mixed fluid of the processing liquid and the steam, from the liquid discharge, by applying a correlation between the pressure of the steam and an associated discharge temperature of the mixed fluid of the processing liquid and the steam, for removal of a resist film on a substrate surface when the substrate is held on the holder, 2) obtain the pressure of the steam from the pressure sensor, and 3) signal the pressure adjuster to adjust the pressure of the steam flowing through the supply line to a pressure, which corresponds to a selected discharge temperature of the mixed fluid of the processing liquid and the steam in accordance with the correlation.

11. A substrate processing apparatus comprising:
a holder configured to hold a substrate;
a liquid discharge configured to discharge a processing liquid to the substrate held by the holder;
a first supply configured to supply the processing liquid to the liquid discharge;
a second supply configured to supply steam to the liquid discharge the second supply comprising:
- a steam generator configured to generate steam;
- a supply line configured to supply the steam from the steam generator to the liquid discharge;
- a pressure sensor configured to measure a pressure of the steam flowing through the supply line;
- a pressure adjuster configured to adjust the pressure of the steam flowing through the supply line; and
- a stabilizer in communication with the supply line intermediate the steam generator and 1) the pressure sensor, and 2) the pressure adjuster, the stabilizer configured for performing a feedback control of the steam pressure in the supply line; and a controller at least in communication with the pressure adjuster, and is configured to: 1) determine a discharge temperature of a mixed fluid of the processing liquid and the steam, from the liquid discharge, by applying a correlation between the pressure of the steam and an associated discharge temperature of the mixed fluid of the processing liquid and the steam, for removal of a resist film on a substrate surface when the substrate is held on the holder, 2) obtain the pressure of the steam from the pressure sensor, and 3) signal the pressure adjuster to adjust the pressure of the steam flowing through the supply line to a preset pressure, so that the preset pressure of the steam corresponds to a selected discharge temperature of the mixed fluid of the processing liquid and the steam in accordance with the correlation.

* * * * *